United States Patent [19]

Matsumura et al.

[11] Patent Number: 4,604,577
[45] Date of Patent: Aug. 5, 1986

[54] TEMPERATURE-COMPENSATED MAGNETIC FIELD MEASURING INSTRUMENT

[75] Inventors: Hiroyoshi Matsumura, Saitama; Toshio Katsuyama, Hachioji; Norio Ohta, Sayama; Tsuneo Suganuma, Tokorozawa; Kazuyuki Nagatsuma, Hachioji; Yutaka Sugita, Tokorozawa, all of Japan

[73] Assignee: Hitachi, Ltd., Tokyo, Japan

[21] Appl. No.: 462,765

[22] Filed: Feb. 1, 1983

[30] Foreign Application Priority Data

Feb. 15, 1982 [JP] Japan .................................. 57-21121

[51] Int. Cl.[4] .................. G01R 33/02; G02B 5/30; G02F 1/09
[52] U.S. Cl. ...................................... 324/244; 350/378
[58] Field of Search .................. 324/244, 96; 350/375, 350/376, 377, 378

[56] References Cited

U.S. PATENT DOCUMENTS 3,621,390  11/1971  Willisen ................................ 350/377
3,707,321  12/1972  Jaecklin et al. ..................... 350/378
4,112,367   9/1978  Hepner et al. ...................... 324/244

Primary Examiner—Ernest F. Karlsen
Assistant Examiner—Walter E. Snow
Attorney, Agent, or Firm—Antonelli, Terry & Wands

[57] ABSTRACT

A measuring instrument of magnetic field utilizing Faraday rotation is disclosed in which a medium exhibiting Faraday rotation includes at least one thin magnetic garnet film magnetized in a propagation direction of light and having a composition expressed by a general formula $R_{3-x}Q_x(Fe_{5-y}M_y)O_{12}$ (where R indicates at least one element selected from a group consisting of Y, La, Lu, Ca, Sm and Bi, Q indicates at least one element selected from a group consisting of Gd, Eu, Er, Tm, Tb, Yb, Ho and Dy, M is at least one element selected from a group consisting of Ga, Al, Ge, Si, Sc, Mn, In, V and Cr, the value of x lies in a range expressed by a formula $0.1 \leq x \leq 3.0$, and the value of y lies in a range expressed by a formula $0 \leq y \leq 5.0$). According to this instrument, stable measured values are obtained independently of temperature variation.

23 Claims, 11 Drawing Figures

TEMPERATURE-COMPENSATED MAGNETIC FIELD MEASURING INSTRUMENT

The present invention relates to a magnetic field measuring instrument, and more particularly to a magnetic field measuring instrument which includes an optical fiber and utilizes the rotation of optical polarization plane to stably measure a magnetic field independently of temperature variation.

In order to prevent a fault from occurring in an invisible inner portion of a transformer or breaker in which a high voltage is generated, or to maintain insulation required in a high-tension apparatus, it is effective to inspect at ordinary times the disorder of and change in an electric or magnetic field generated in these apparatuses.

A detection coil formed of a metal wire has hitherto been used to detect a magnetic field in a high voltage apparatus, and to convert the magnetic field into an electric current or voltage. In the case where a measured portion occupies a large space and therefore insulation can be maintained even when the metal coil is inserted into the measured portion, the metal coil can be disposed in the measured portion to detect a magnetic field. However, in the case where a measured portion is narrow and moreover a high voltage is applied across the measured portion, breakdown is readily generated by inserting the metal coil into the measured portion, and therefore the use of the metal coil is very dangerous. Especially, it is impossible to use the metal coil in a transformer which is provided in a substation to generate a high voltage, for example, 100 or 500 KV.

In such a case, it is desirable to use a highly insulating medium such as an optical fiber. However, it is difficult to measure the magnetic field in a narrow space by a conventional measuring instrument which utilizes light to measure a magnetic field.

In order to overcome the above-mentioned difficulties of the prior art, a magnetic field measuring instrument utilizing an optical fiber and the Faraday rotation in magnetic garnet has been proposed, in recent years. (See a Japanese utility model application Laid-open No. 14879/82). Further, an improved version of the above measuring instrument for enhancing both of sensitivity and accuracy has been invented by Matsumura et al., and filed in Japan. (That is, a Japanese patent application No. 112742/77). It is to be noted that this improved measuring instrument is not a prior art of the present invention but a prior invention.

However, both of the above measuring instruments have a drawback that measured values vary with temperature. This is because the measurement of magnetic field using highly-insulating glass or crystals is affected by temperature due to the variation of the refractive index or birefringence of these media with temperature.

The following references are cited to show the state of the art; (i) a Japanese utility model application specification (Utility Model Laid-open No. 14879/82), (ii) a Japanese patent application specification (Patent Laid-open No. 67764/81), and (iii) a Japanese patent application specification (Patent Laid-open No. 29174/81).

An object of the present invention is to provide an instrument which can measure a magnetic field in a narrow space readily and safely, and which is stable to temperature variation.

Another object of the present invention is to provide an instrument which can precisely measure a weak magnetic field of hundreds of gauss or less.

In order to attain the above objects, a magnetic field measuring instrument according to the present invention is made up of a light source part, a magnetic field sensing part including a magnetic material provided with a medium capable of exhibiting Faraday rotation, a measuring part for measuring light power from the magnetic field sensing part, and an optical transmission line for optically connecting the light source part, magnetic field sensing part and measuring part. The magnetic material is provided with at least one thin magnetic garnet film magnetized in a propagation direction of light and made of the following medium, and has a temperature-compensated characteristic. The medium capable of exhibiting Faraday rotation has a composition expressed by a general formula $R_{3-x}Q_x$ $(Fe_{5-y} M_y) O_{12}$ (where R indicates at least one element selected from a group consisting of Y, La, Lu, Ca, Sm and Bi, Q indicates at least one element selected from a group consisting of Gd, Ew, Er, Tm, Tb, Yb, Ho and Dy, M indicates at least one element selected from a group consisting of Ga, Al, Ge, Si, Sc, Mn, In, V and Cr, the value of x lies in a range expressed by a formula $0.1 < x \leq 3.0$, and the value of y lies in a range expressed by a formula $0 \leq y \leq 1.5$).

For manufacturing reasons, the thin magnetic garnet film is formed by the liquid phase epitaxial growth method or chemical vapor deposition method on both or one of a pair of main surfaces of a paramagnetic substrate, which is made of one of gadolinium gallium garnet $Gd_3 Ga_5 O_{12}$, neodymium gallium garnet $Nd_3 Ga_5 O_{12}$ and samarium gallium garnet $Sm_3 Ga_5 O_{12}$ (hereinafter referred to as "GGG", "NdGG" and "SmGG", respectively), so that the direction of magnetization is perpendicular to the main surfaces. The thin magnetic garnet film thus formed is coupled with the optical transmission line so that the direction of magnetization is coincident with a propagation direction of light. The optical transmission line used may be an optical fiber such as a single mode fiber, a multimode fiber, or a bundle of optical fibers.

A first example of the magnetic field sensing part includes a lens, a polarizer, the above-mentioned magnetic material, an analyzer, and another lens which are arranged, in the order described, between the optical fiber on the side of the light source part and that on the side of the measuring part.

In this example, the magnetic material has a structure that the thin magnetic garnet film is formed on a surface of the paramagnetic substrate facing the polarizer and/or another surface of the substrate facing the analyzer. Further, when the transmission axis of the polarizer makes an angle of 45° with that of the analyzer, maximum sensitivity is obtained. However, the angle between the transmission axes of the polarizer and analyzer is not limited to 45°.

A second example of the magnetic field sensing part includes a lens, a polarizer, the thin magnetic garnet film, the paramagnetic substrate and a reflecting film which are arranged on an end face of the optical fiber in the order described.

The thin magnetic garnet film used in the above-mentioned examples of the magnetic field sensing part has such a composition as the value of x in the general formula lies in a range $0.1 \leq x \leq 3.0$. Preferably, the value of x lies in a range $0.1 \leq x \leq 0.9$. It is especially preferable that the value of x lies in a range $0.1 \leq x \leq 0.5$. When the value of x is nearly equal to 0.2, the most favorable results are obtained. When the value of x lies outside the abovementioned ranges, the Faraday rotation in the thin magnetic garnet film varies greatly with temperature, and therefore such compositions are undesirable. When the value of x is nearly equal to 0.2, the Faraday rotation scarcely varies with temperature, and therefore such a composition is most favorable.

Gadolinium Gd is typically used as the element Q in the previously-mentioned general formula. In this case, a typical composition of the thin magnetic garnet film is $(Y_{0.3} Sm_{0.5} Lu_{1.4} Ca_{0.6}) Gd_{0.2} (Fe_{4.4} Ge_{0.6}) O_{12}$.

The magnetic material may be formed by combining a plurality of paramagnetic substrates each having on at least one end face thereof the thin magnetic garnet film, so that thin magnetic garnet films are parallel to each other.

In the first or second example of the magnetic field sensing part previously mentioned, the magnetic material may have the following structure. That is, a paramagnetic substrate having on at least one end face thereof a first thin magnetic garnet film is combined with another paramagnetic substrate having on at least one end face thereof a second thin magnetic garnet film so that the first and second films are parallel to each other, and the value of x in the general formula corresponding to the composition of each of the first and second films is selected so that the temperature characteristic of Faraday rotation in the first film and that in the second film compensate each other.

Alternatively, the magnetic material may have the following structure. That is, at least one paramagnetic substrate is included in the magnetic material, first and second thin magnetic garnet films are formed on one and the other of parallel end faces of the paramagnetic substrate, respectively, and the value of x in the general formula corresponding to the composition of each of the first and second thin magnetic garnet films is selected so that the temperature characteristic of Faraday rotation in the first film and that in the second film compensate each other. As mentioned above, in these case, the compositions of the first and second thin magnetic garnet films are selected so that the temperature characteristic of Faraday rotation in the first film is compensated by that in the second film. Accordingly, a large number of combinations can be used for the compositions of the first and second films. When the value of x in the general formula corresponding to the composition of the second thin magnetic garnet film is zero, the value of x in the general formula corresponding to the composition of the first thin magnetic garnet film is put in a range $0.3 \leq x \leq 3.0$, and preferably in a range $0.5 \leq x \leq 1.5$. Especially, when the value of x is nearly equal to 0.7, the most favorable results are obtained. When the value of x corresponding to the composition of the first thin garnet film lies outside the above-mentioned ranges, it is impossible to sufficiently compensate the temperature characteristic of Faraday rotation in the first thin magnetic garnet with that in the second thin magnetic garnet film having a composition indicated by the value of x equal to zero, and therefore such combinations are undesirable. When the value of x corresponding to the composition of the first film is nearly equal to 0.7, the above-mentioned compensation is performed substantially completely, and therefore such a combination is most desirable.

Gadolinium is typically used as the element Q in the general formula, even in the case where two kinds of thin magnetic garnet films are used. In this case, a typical composition of the first thin magnetic garnet film is $(Y_{0.1} Sm_{0.2} Lu_{1.4} Ca_{0.6}) Gd_{0.7} (Fe_{4.4} Ge_{0.6}) O_{12}$ Although the magnetic material in the first example of the magnetic field sensing part has been explained in the foregoing description, the second example of the magnetic field sensing part also may include a plurality of thin magnetic garnet films whose temperature characteristics with respect to Faraday rotation compensate each other.

A third example of the magnetic field sensing part has the following structure. That is, that portion of the first example which follows the polarizer, is divided into two systems. A relation between a ratio $V_e d_m / V'_e d'_m$ and temperature is stored in first storage means where $V_e$ and $V'_e$ indicate respective Verdet's constants of two thin magnetic garnet films which are different from each other in composition and are provided in respective magnetic materials of these two systems, and $d_m$ and $d'_m$ indicate respective thicknesses of the thin magnetic garnet films. A ratio $$\left( \frac{P_2}{KP_1} - \frac{1}{2} \right) \bigg/ \left( \frac{P'_2}{K'P_1} - \frac{1}{2} \right)$$

is calculated by temperature-determining means to determine the temperature of the magnetic field sensing part by the temperature-determining means on the basis of the calculated ratio $$\left( \frac{P_2}{KP_1} - \frac{1}{2} \right) \bigg/ \left( \frac{P'_2}{K'P_1} - \frac{1}{2} \right)$$

and the above-mentioned relation stored in the first storage means, where K and K' indicate transmission efficiencies of respective light having passed through the magnetic materials, $P_1$ indicates an output due to light having reached a photo-detector without passing through the magnetic field sensing part, and $P_2$ and $P'_2$ indicate outputs due to respective light having passed through the magnetic materials. A temperature characteristic of a product $V_e \cdot d_m$ is stored in second storage means and a corrected value of $V_e \cdot d_m$ is calculated by temperature correction means on the basis of a temperature value from the temperature-determining means and the temperature characteristic of $V_e \cdot d_m$ stored in the second storage means. The first storage means, temperature-determining means, second storage means, and temperature correction means are provided in the measuring part.

In the above-mentioned measuring instruments of magnetic field according to the present invention, the value of y in the general formula is put in a range $0 \leq y \leq 1.5$ as mentioned previously, and preferably in a range $0.3 \leq y \leq 1.0$. The value of y in the previously-mentioned typical composition of the thin magnetic garnet film is about 0.6. When the value of y lies outside the above-mentioned ranges, the saturation flux density in the thin magnetic garnet film deviates from a desired range, and thus a measurable magnetic field is very weak (that is, lies in a range of zero to 5 $O_e$), or is too strong to obtain desired accuracy. Accordingly, such a composition is unfavorable.

When linearly-polarized light is incident vertically upon a thin magnetic garnet film and a magnetic field is applied thereto, the plane of polarization of the linearly-polarized light is rotated. The angle of this rotation is not only determined by the strength of the applied magnetic field and the thickness of the thin film, but also varies with ambient temperature. However, when the composition of the thin magnetic garnet film is made optimum, for example, yttrium is used as the element R in the general formula expressing the composition and gadolinium is substituted for part of yttrium (that is, gadolinium is used as the element Q in the general formula), the thin magnetic garnet film is scarcely affected by temperature. Further, when the doping of gadolinium is increased in such a composition, the temperature characteristic of the thin film containing a large amount of gadolinium becomes opposite to that of the thin film containing no gadolinium. In more detail, the rotation of linear polarization in the thin film containing a large amount of gadolinium decreases with temperature in a temperature range, though the rotation of linear polarization in the thin film containing no gadolinium increases with temperature. Accordingly, a temperature-insensitive, magnetic field sensor can be formed by combining the thin film containing a large amount of gadolinium with the thin film containing no gadolinium. As can be seen from the above, the present invention is based upon the inventors' discovery that the temperature characteristic of Faraday rotation in magnetic garnet having a composition expressed by $R_3(Fe,M)_5O_{12}$ can be changed greatly by adding to the magnetic garnet one or more elements selected from a group consisting of Gd, Eu, Er, Tm, Tb, Ho, Dy and Yb.

In a magnetic field measuring instrument of magnetic field according to the present invention, sensing part can be readily inserted into a narrow space, since the sensing part is mounted at an end portion or in the middle of an optical fiber and moreover small in size. Further, the measuring instrument is not affected by an external voltage or current, since the sensing part is connected to a measuring part through the optical fiber. Accordingly, the present invention provides measuring means making possible the measurement of magnetic field in a high-tension apparatus which has been very difficult in the prior art. Further, according to the present invention, a measuring medium used is small in size and large in Faraday rotation, and moreover the direction of magnetization in a thin magnetic garnet film is made perpendicular to the main surfaces of the substrate. Thus, even a relatively weak magnetic field can be precisely measured, as made apparent from the following explanation of embodiments.

The present invention will be apparent from the following detailed description taken in conjunction with the accompanying drawings, in which.

EMBODIMENT 1

Figure 1:
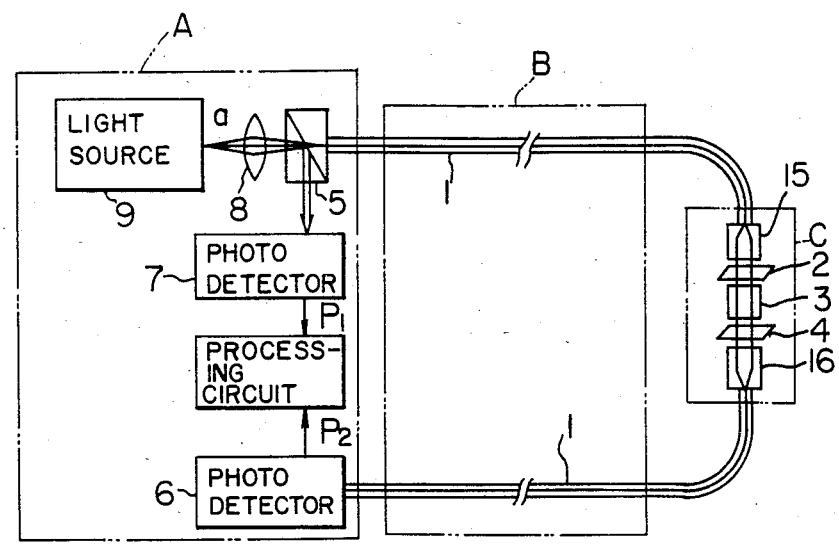
FIG. 1 is a block diagram showing an embodiment of a magnetic field measuring instrument according to the present invention.

FIG. 1 shows, in block diagram form, an embodiment of a magnetic field measuring instrument according to the present invention. Referring to FIG. 1, the embodiment includes a measuring part A, a light transmission part B and a magnetic field sensing part C, and utilizes transmitted light which has been subjected to Faraday rotation. The light transmission part B is made of a single optical fiber. In the measuring part A, the position of a lens 8 is adjusted so that light a emitted from a light source 9 impinges upon an optical fiber 1 as much as possible, as in a general optical measuring system. Light from the lens 8 is divided by a half mirror (namely, beam splitter) 5 into two parts, one of which is injected into the optical fiber to be led to the sensing part C. The other part of light is led to a photo-detector 7 to be converted into an electrical output signal $P_1$. As will be explained later, light from the sensing part C is led to a photo-detector 6 to be converted into an electrical output signal $P_2$. In the sensing part C, a collimation lens 15, a polarizer 2, and a magnetic material 3 which will be explained later in detail, are arranged on an end face of the optical fiber 1 so that adjacent members are kept in close contact with each other. Further, an analyzer 4 and a focusing lens 16 are arranged on an end face of the magnetic material 3 opposite to the polarizer 2 in such a manner that adjacent members are kept in close contact with each other and an angle between the transmission axes of the polarizer and analyzer becomes equal to 45°.

When light is incident upon the polarizer 2, only a light component having the plane of polarization parallel to the transmission axis of the polarizer 2, that is, linearly-polarized light passes through the polarizer 2, and then reaches the magnetic material 3. When no magnetic field is applied to the sensing part C, light incident upon the magnetic material 3 leaves the magnetic material without changing the state of polarization, and then reaches the analyzer 4. The direction of the transmission axis of the analyzer 4 is determined as mentioned below.

Now, let us consider the state that the polarizer 2 and analyzer 4 stand opposite to each other with an angle of $\theta$ radian between transmission axes thereof. When the angle of Faraday rotation in the magnetic material 3 applied with a magnetic field is expressed by F (radian), an output $P_{out}$ due to light having passed through the analyzer 4 is given by the following equation:

$$P_{out} = K \cos^2(\theta - F) \tag{1}$$

where k is a proportional constant.

The derivative of the output $P_{out}$ with respect to the angle F of Faraday rotation is given by the following equation:

$$\frac{dP_{out}}{dF} = k \sin\{2(\theta - F)\} \tag{2}$$

$$\approx k \sin(2\theta)$$

It is known from the above that a change in output is maximum when $\theta$ is equal to $\pi/4$.

The output $P_{out}$ corresponding to $\theta = \pi/4$ can be calculated from Equation (1), and is given by the following equation:

$$P_{out} = \frac{k}{2}\{1 + \sin(2F)\} \tag{3}$$

For small values of the angle F, the output $P_{out}$ can be approximated by the following equation $$P_{out} = \frac{k}{2}(1 + 2F) \tag{4}$$

That is, a linear relation exists between the output $P_{out}$ and the angle F of Faraday rotation. For this reason, it is preferable that the transmission axis of the analyzer 4 makes an angle of 45° with that of the polarizer 2.

Figure 2A:
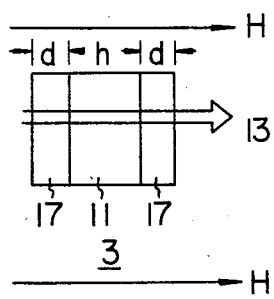
FIGS. 2a and 2b are schematic views showing different structures of the magnetic material shown in FIG. 1.
Figure 2B:
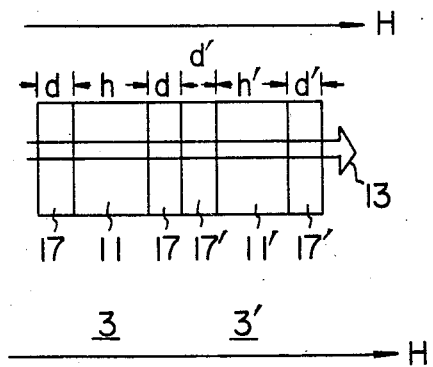

The magnetic material 3 is provided with at least one thin magnetic garnet film 17, as shown in FIGS. 2a and 2b. FIG. 2a shows the case where a single magnetic material is used, and FIG. 2b the case where two magnetic materials are combined with each other, that is, two substrates 11 and 11' provided respectively with thin magnetic garnet films 17 and 17' are used. One magnetic material 3 has a structure that the thin magnetic garnet film 17 having a thickness d is formed on one or both of end faces of a GGG substrate 11 having a thickness h. The thickness d is usually put in a range of 1 to 100 μm, and is put in a range of 5 to 25 μm in the present embodiment. When the thickness d is smaller than the above ranges, the angle of Faraday rotation is very small. On the other hand, when the thickness d is larger than the ranges, the transmittance of light passing through the thin film is reduced. These are both unfavorable. The substrate 11 has flat end faces perpendicular to a <111> crystallographic axis. The thin magnetic garnet film 17 is formed by the liquid phase epitaxial growth method or chemical vapor deposition method. The direction of magnetization in the thin magnetic garnet film is parallel to a propagation direction 13 of light, that is, perpendicular to the end faces of the film.

The thin magnetic garnet film has such a composition as $(Y,Sm)_3(Fe,Ga)_5O_{12}$, $Y_3Fe_5O_{12}$, $(Bi,Sm)_3(Fe,Ga)_5O_{12}$, or $(Y,Sm,Lu,Ca)_3(Fe,Ge)_5O_{12}$.

Now, explanation will be made of the thin magnetic garnet film having the composition expressed by the following formula:

$$(Y,Sm,Lu,Ca)_3(Fe,Ge)_5O_{12} \tag{5}$$

Figure 3:
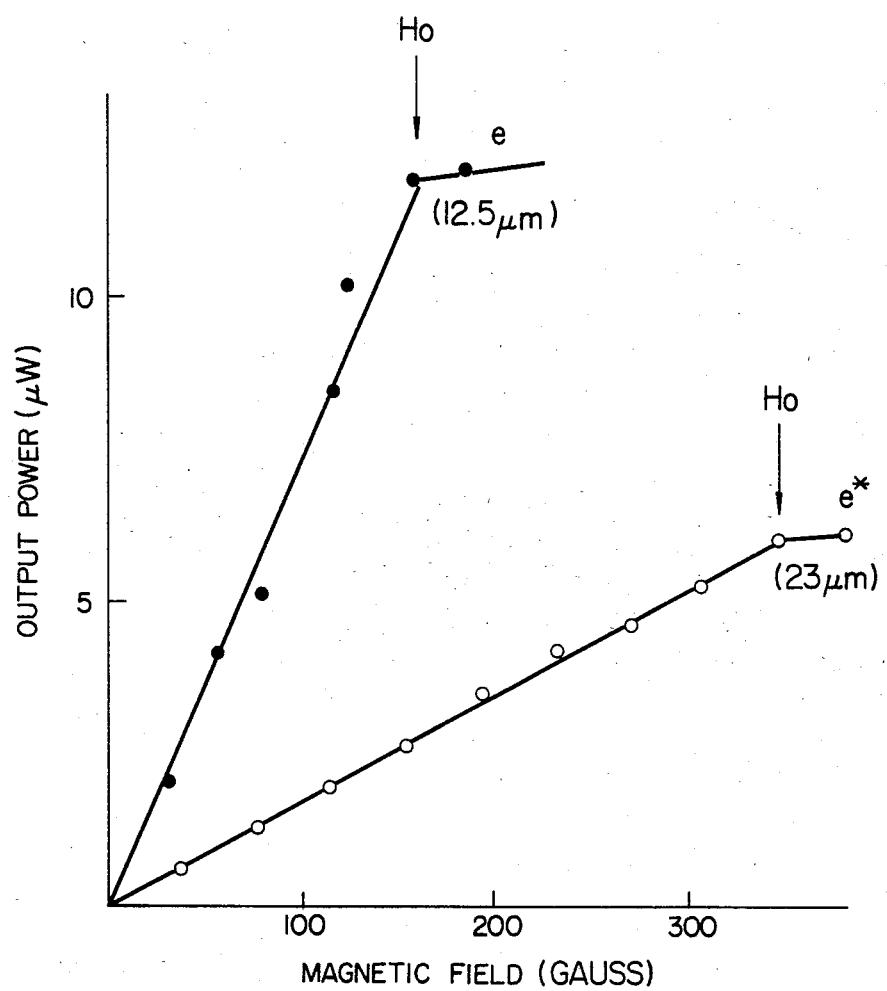
FIG. 3 is a graph showing relations between the strength of magnetic field in the magnetic material of FIG. 1 and an output caused by Faraday rotation.

Other compositions can be treated in the same manner as this composition. The substrate 11 used for measurements was a GGG plate with (111) crystallographic plane and having a thickness of 0.35 mm. The angle between the transmission axes of the polarizer 2 and analyzer 4 was made equal to 45°. A magnetic field was applied perpendicularly to an end face of the magnetic material 3, that is, in the propagation direction of light, as indicated by reference symbol H in FIGS. 2a and 2b, and the variation of the output $P_2$ with magnetic field was measured. FIG. 3 shows measured values which were obtained by light having a wavelength of 0.63 μm for two kinds of thin magnetic garnet films having compositions expressed by the formula (5). These compositions was made different from each other in substitution of Ge for Fe, to change saturation magnetic field. The collapse field $H_o$ of the stripe domain in the thin magnetic garnet film and the size of the stripe domain can be varied by slightly changing the amount of Ge substituted for Fe and by changing anisotropic energy dependent on the amount of Sm. In FIG. 3, reference symbol e designates a thin magnetic garnet film whose stripe domain has a size of 2 μm, and e* a thin magnetic garnet film whose stripe domain has a size of 7 μm. The film e has a composition expressed by $(Y_{0.7}Sm_{0.5}Lu_{1.2}Ca_{0.6})(Fe_{4.4}Ge_{0.6})O_{12}$, and the film e* has a composition expressed by $(Y_{1.5}Sm_{0.3}Lu_{0.3}Ca_{0.9})(Fe_{4.1}Ge_{0.9})O_{12}$. Further, in FIG. 3, a numerical value in the parenthesis indicates the thickness d of each thin magnetic garnet film in microns. As shown in FIG. 3, the output $P_2$ increases linearly with magnetic field in a magnetic field range below a magnetic field $H_o$(gauss), and then increases with a small, constant slope. The magnetic field $H_o$ depends upon the amount of Ge, and are 130 and 340 gauss for the thin magnetic garnet films e and e* respectively.

The derivative of the output with respect to magnetic field varies at the magnetic field $H_o$ for the reasons that the angle of Faraday rotation per unit magnetic field is smaller in the GGG substrate than in the thin magnetic garnet film, and that the collapse field of the stripe domain in the thin magnetic garnet film is equal to $H_o$ and smaller than a saturation magnetic field $H_1$ in the GGG substrate. Referring to FIG. 3, a large variation of output with magnetic field in a magnetic field range below the magnetic field $H_o$ is due to the Faraday rotation in the thin magnetic garnet film, and a small variation of output in a magnetic field range above the magnetic field $H_o$ is due to the Faraday rotation in the GGG substrate. Thus, when the magnetic material 3 having the thin magnetic garnet film on the GGG substrate is used in the magnetic field sensing part, a weak magnetic field is measured with high sensitivity by the thin magnetic garnet film, and a strong magnetic field can be measured by the Faraday rotation in the substrate.

Figure 4:
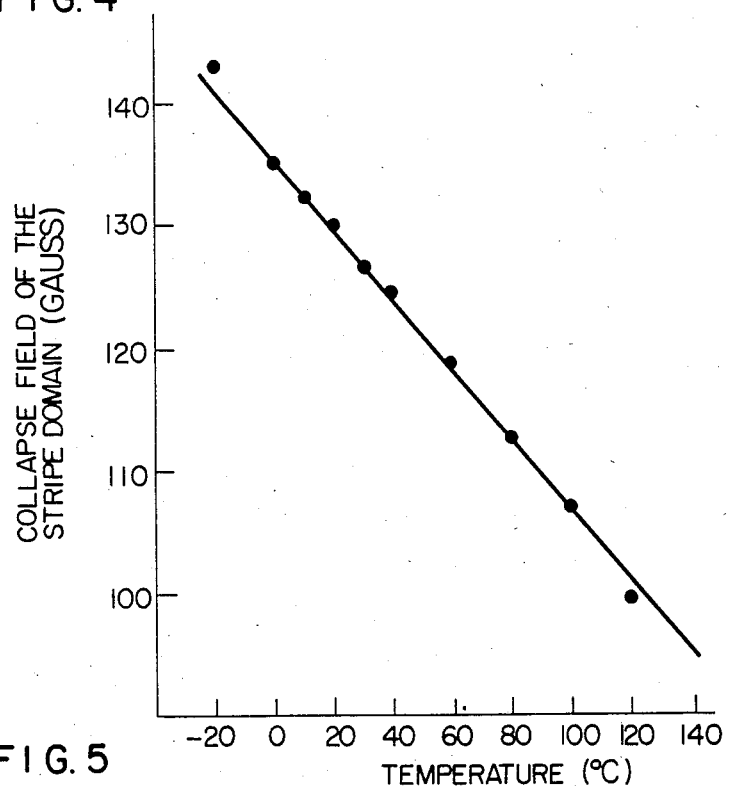
FIG. 4 is a graph showing a relation between the temperature of a thin magnetic garnet film used in the embodiment of FIG. 1 and the collapse field $H_o$ of stripe domain in the thin film.

FIG. 3 shows measured values in the case where the thin magnetic garnet films having compositions expressed by the formula (5) are used at room temperature. When ambient temperature is changed, the slope of each of the straight lines shown in FIG. 3 is varied. This is because the collapse field $H_o$ of the stripe domain in the thin magnetic garnet film varies with temperature. As shown in FIG. 3, the collapse field $H_o$ in the thin magnetic garnet film e is equal to 130 gauss at room temperature. When the temperature of the thin film e is varied in a range from $-20°$ to 120° C., the collapse field varies linearly with temperature in a range from 142 to 99 gauss, as shown in FIG. 4. That is, the collapse field at $-20°$ C. is 9% larger than that at room temperature, and the collapse field at 120° C. is 23% smaller than that at room temperature. In other words, when a magnetic field is measured, the magnetic field-output characteristics shown in FIG. 3 vary with temperature as mentioned above. However, the variation of collapse field with temperature is linear, and can be expressed by a straight line shown in FIG. 4 and having a slope of 33%/140° C., namely, 0.23%/°C.

In order to improve the temperature characteristic of collapse field, it is effective to dope the thin magnetic garnet film with gadolinium Gd. Further, europium Eu, erbium Er, thulium Tm, terbium Tb, holmium $H_o$, dysprosium Dy, Ytterbium Yb, or a combination thereof may be used in place of gadolinium. The above-mentioned elements are substituted for part of the element R in the previously-mentioned general formula.

Now, explanation will be made on the case where Gd is added to the tin magnetic garnet film. For example, when Gd is added to a composition expressed by the formula (5) so that another composition expressed by $(Y,Sm,Lu,Ca)_{3-x}Gd_x(Fe,Ge)_5O_{12}$ (where $x=0.1$) is obtained, the slope of the straight line shown in FIG. 4 is decreased by 0.1%/°C., and thus the temperature characteristic of collapse field is improved.

Figure 5:
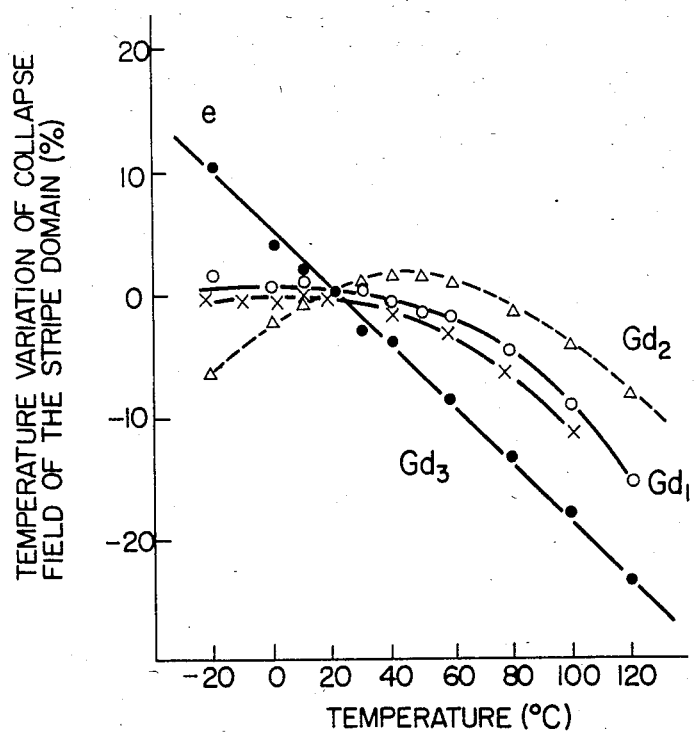
FIG. 5 is a graph showing relations between the temperature of a thin magnetic garnet film used in embodiments of the present invention and the deviation of a collapse field $H_o$ at each temperature from a collapse field at room temperature.

FIG. 5 shows a relation between temperature and a ratio of a difference between a collapse field $H_o$ of stripe domain at each temperature and a collapse field at room temperature to the collapse field at room temperature for each of two kinds of thin magnetic garnet films, one of which has a composition $(Y_{0.3}Sm_{0.5}Lu_{1.4}Ca_{0.6})Gd_{0.2}(Fe_{4.4}Ge_{0.6})O_{12}$, and the other has a composition $(Y_{0.1}Sm_{0.5}Lu_{1.5}Ca_{0.6})Gd_{0.3}(Fe_{4.4}Ge_{0.6})O_{12}$. In other words, these compositions are obtained by adding Gd to a composition expressed by the formula (5) and by making the value of x equal to 0.2 or 0.3. For comparison, the above-mentioned relation for the thin magnetic garnet film e (corresponding to $x=0$) is also shown in FIG. 5. In FIG. 5, reference symbol $Gd_1$ designates the thin magnetic garnet film corresponding to $x=0.2$, and $Gd_2$ the thin magnetic garnet film corresponding to $x=0.3$.

As is seen from FIG. 5, the collapse field in the thin magnetic garnet film Gd, scarcely varies with temperature in a temperature range from $-20°$ to $60°$ C. and the thin magnetic garnet film $Gd_2$ is opposite to the thin magnetic garnet film e in the gradient of a curve indicating the temperature characteristic of collapse field.

When the thin magnetic garnet film $Gd_1$ is used as a magnetic field sensor, a single substrate can be used in the magnetic material as shown in FIG. 2a, since the thin film $Gd_1$ has an excellent temperature characteristic. Further, when the thin magnetic garnet films e and $Gd_2$ opposite to each other in temperature characteristic of collapse field are combined to be used as a magnetic field sensor, this combination can exhibit an excellent temperature characteristic. In this case, it is desirable to include two substrates in the magnetic material as shown in FIG. 2b.

The angle F of Faraday rotation is given by a product of a Verdet's constant Ve peculiar to matter, an applied magnetic field H, and the thickness 2 dm of the thin magnetic garnet film ($d_m$ for the case where the film is provided only on one surface of the substrate), that is, the angle F is expressed by the following equation:

$$F = 2V_e d_m H \quad (6)$$

Referring back to FIG. 1, light having passed through the optical fiber 1 is incident upon the lens 15, by which light rays are collimated. Of light components from the lens 15, only a linearly-polarized component passes through the polarizer 2 to impinge on the magnetic material 3. The plane of polarization of the linearly-polarized light incident on the magnetic material is rotated by an applied magnetic field H through an angle of $2V_e d_m H$ radian. Light having passed through the analyzer is $(\frac{1}{2}+2V_e d_m H)$ times the incident light in intensity, and is focused on an end face of the optical fiber 1 by the lens 16. Light having passed through the optical fiber 1 is received by the photo-delector 6. Taking into consideration that the transmission efficiency of light is decreased to look percent due to the transmission loss in the optical fiber, the coupling loss in the sensing part C, the transmission loss in the magnetic material 3, and others, the output $P_2$ of the photo-detector 6 is given by an equation $P_2 = KP_1(\frac{1}{2}+2V_e d_m H)$. The constant K is determined when the measuring instrument is fabricated, and therefore is known. Accordingly, the magnetic field H can be determined by the following equation:

$$H = \left\{ \frac{P_2}{KP_1} - \frac{1}{2} \right\} / 2V_e d_m \quad (7)$$

It is possible to automatically calculate the magnetic field H on the basis of the outputs $P_1$ and $P_2$ by providing in the measuring part A a circuit for performing calculation corresponding to Equation (7). The present embodiment for measuring a magnetic field was stable to temperature variation, and moreover excellent in sensitivity.

EMBODIMENT 2

Figure 6:
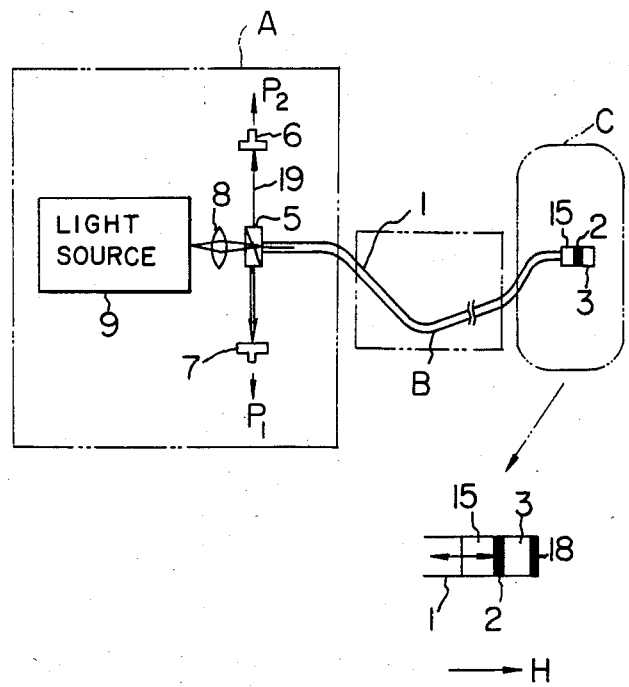
FIG. 6 is a block diagram showing another embodiment of a measuring field measuring instrument according to the present invention.

FIG. 6 shows another embodiment of a measuring instrument of magnetic field according to the present invention. In the present embodiment, reflected light is used in place of transmitted light. Accordingly, an end face of a magnetic material 3 is coated with a reflecting film 18 which can reflect light having a wavelength used, more than light having other wavelengths. Now, the operation of the present embodiment will be explained. Of light components incident upon a polarizer 2, only a linearly-polarized component passes through the polarizer 2 to impinge on a magnetic material 3. When no magnetic field is applied to a sensing part C, the linearly-polarized light incident on the magnetic material 3 is reflected back from the reflecting film 18 without changing the state of polarization, to return to the polarizer 2. Accordingly, the plane of polarization of the reflected light is parallel to the transmission axis of the polarizer, and therefore the reflected light passes therethrough. The light from the polarizer 2 is led to a measuring part A through an optical fiber 1. The light thus led is incident on a half mirror 5, which produces emergent light 19. The emergent light 19 is converted by a photo-detector 6 into an electrical output $P_2$. When a magnetic field H is applied to the sensing part C, the output $P_2$ varies in accordance with Equation (1) corresponding to $\theta = 0$. In the present embodiment, the magnetic material 3 includes one or two substrates as shown in FIGS. 2a and 2b, and at least one thin magnetic garnet film contains Gd to make the magnetic material a temperature-compensated one. With respect to other members and arrangements, the present embodiment is identical with EMBODIMENT 1. The present embodiment produced the same favorable experimental results as EMBODIMENT 1.

EMBODIMENT 3

Figure 7A:
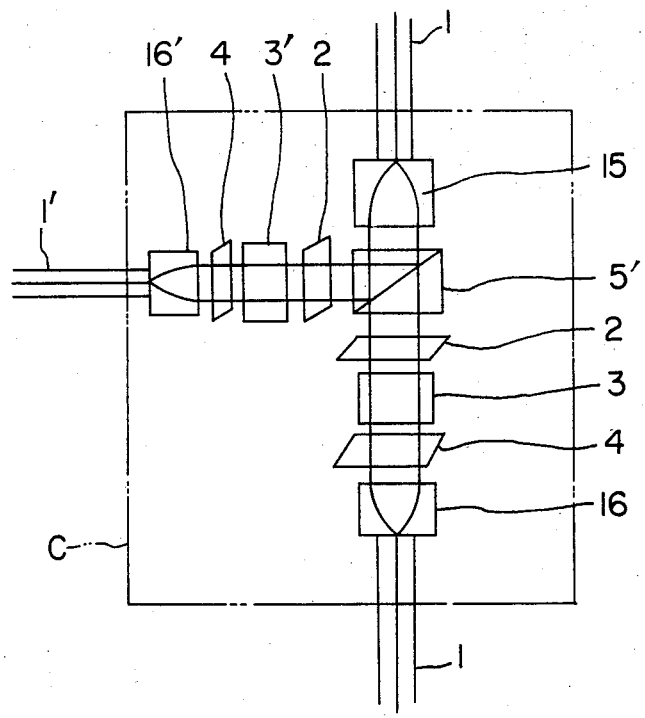
FIGS. 7a and 7b are schematic views showing a further embodiment of a magnetic field measuring instrument according to the present invention.
Figure 7B:
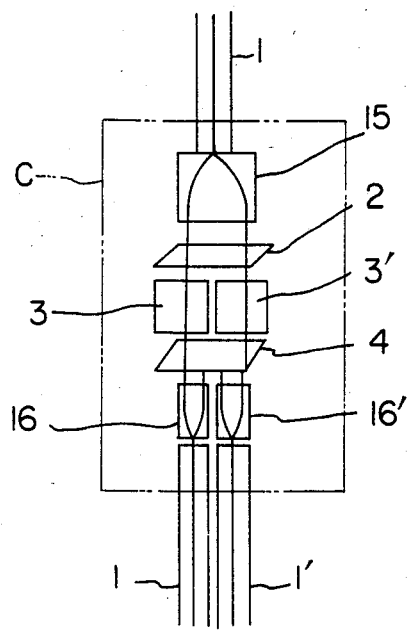
Figure 9:
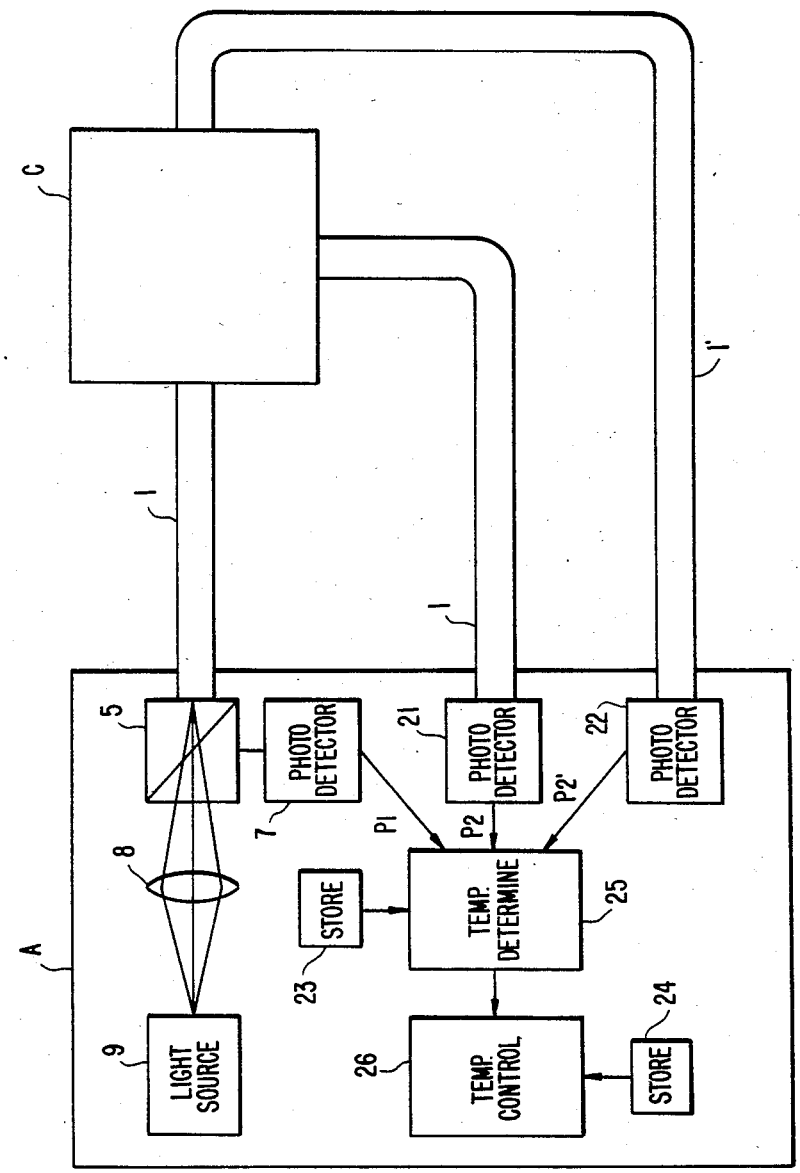
FIG. 9 is a block diagram showing another embodiment of a magnetic field measuring instrument according to the present invention.

FIGS. 7a and 7b show two kinds of sensing parts C which are used in a further embodiment of a measuring instrument of magnetic field according to the present invention as shown in FIG. 9. In the present embodiment, temperature compensation is carried out externally. The structure shown in FIG. 7a and that shown in FIG. 7b are different in the following points. That is, in FIG. 7a, light is divided by a half mirror 5' into two light beams. On the other hand, in FIG. 7b, two magnetic materials are arranged in parallel on a light path. However, since the two structures perform the same function, only the structure shown in FIG. 7a will be explained below. Light from a collimation lens 15 is divided by the half mirror 5' into two light beams. Each of the light beams is led to a measuring part A through a polarizer 2, a magnetic material 3 or 3', an analyzer 4, a focusing lens 16 or 16', and an optical fiber 1 or 1'. Needless to say, it is required to provide two photodetectors 21 and 22 in the measuring part A as shown in FIG. 9. The magnetic material 3 are made opposite in temperature characteristic to the magnetic material 3'. For example, the thin magnetic garnet films e and Gd$_2$ shown in FIG. 5 are used in the magnetic materials 3 and 3', respectively. Such a combination of magnetic materials is used to measure temperature with high accuracy, as will be explained later.

As has been explained previously, output P$_2$ and P'$_2$ obtained from the light beams having passed through the optical fibers 1 and 1' are expressed by the following equations:

$$\left. \begin{array}{l} P_2 = KP_1(\frac{1}{2} + 2V_e d_m H) \\ P'_2 = K'P_1(\frac{1}{2} + 2V'_e d'_m H) \end{array} \right\} \quad (8)$$

Since the magnetic materials 3 and 3' are different from each other, a prime (or dash) is put after each of symbols with respect the magnetic material 3' and optical fiber 1'.

Equations (8) can be transformed into the following equation:

$$\frac{\left(\frac{P_2}{KP_1} - \frac{1}{2}\right)}{\left(\frac{P'_2}{K'P_1} - \frac{1}{2}\right)} = \frac{V_e d_m}{V'_e d'_m} \quad (9)$$

Figure 8:
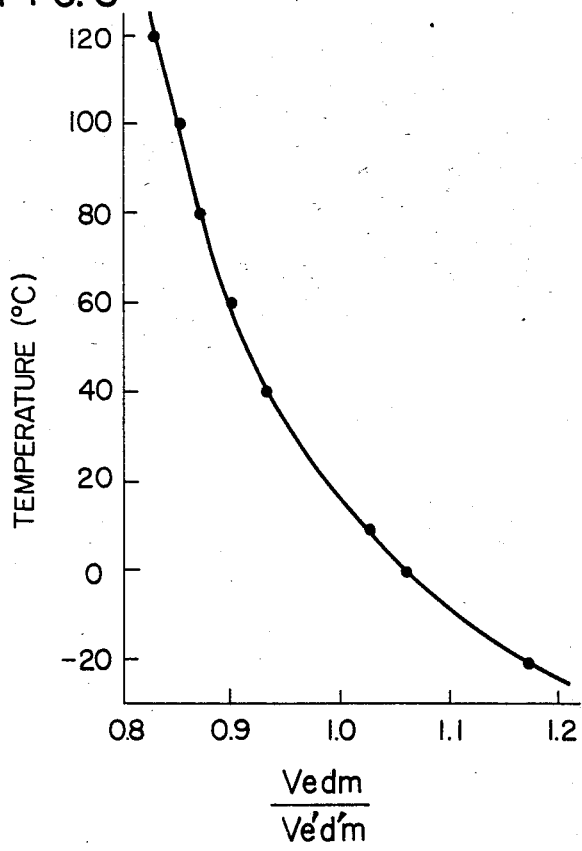
FIG. 8 is a graph showing a relation between a ratio $V_e d_m / V'_e d'_m$ and temperature.

The right-hand side of Equation (9) is a function of temperature and is independent of magnetic field. For example, when the thin magnetic garnet films e and Gd$_2$ are used, a ratio $V_e d_m / V'_e d'_m$ varies with temperature as shown in FIG. 8. Such a temperature characteristic of the ratio $V_e d_m / V'_e d'_m$ is determined by the magnetic materials 3 and 3' at the time the sensing part C is designed, and is previously stored in a memory device 23 included in the measuring part A. Further, a temperature characteristic of a product $V_e d_m$ is previously stored in another memory device 24 in the measuring part. On the other hand, the left-hand side of Equation (9) is determined on the basis of measurements. The left-hand side thus determined is used together with the previously-stored temperature characteristic of the ratio $V_e d_m / V'_e d'_m$, to determine temperature at a measuring time. That is, in the present embodiment as shown in FIG. 9, temperature is first determined in the processor 25. Thereafter, temperature correction is made for the Verdet's constant $V_e$ by the processor 26, and then a magnetic field is determined by Equation (7). Accordingly, both of the magnetic field and temperature can be simultaneously determined. With respect to processing other than the above-mentioned, the present invention is identical with EMBODIMENT 1. The present embodiment was excellent in sensitivity and stable to temperature variation, and moreover was able to measure temperature and magnetic field simultaneously.

EMBODIMENT 4

The saturation magnetic fields (namely, the previously-mentioned collapse fields) $H_o$ of the thin magnetic garnet films used in EMBODIMENT 1 are 130 and 340 gauss, as shown in FIG. 3. In order to be able to measure an abnormal magnetic field, the thin magnetic garnet film is required to have a saturation magnetic field on the order of 600 gauss. In the present embodiment, a composition expressed by a formula (Sm$_{0.65}$Lu$_{1.6}$Gd$_{0.75}$)(Fe$_{4.82}$Al$_{0.18}$)O$_{12}$ is selected to make high the saturation magnetic field $H_o$ and to improve the temperature characteristic of thin magnetic garnet film. A magnetic garnet film having the above-mentioned composition was grown on a main surface of a GGG substrate to a thickness of about 25 μm by the liquid phase epitaxial growth method. The GGG substrate was 0.35 mm in thickness, and the main surface thereof was perpendicular to a <111> crystallographic axis. The saturation magnetic field $H_o$ of this thin magnetic garnet film was 580 gauss. Further, the variation of the saturation magnetic field $H_o$ with temperature was measured, as in EMBODIMENT 1. The results of the measurement are shown in FIG. 5. In FIG. 5, the above thin magnetic garnet film is designated by reference symbol Gd$_2$. It is known from FIG. 5 that, when temperature is changed in a range from −20° to 60° C., a ratio of a difference between a saturation magnetic field at each temperature and a saturation magnetic field at room temperature to the saturation magnetic field at room temperature lies in a range from 0 to −3%. For comparison, a thin magnetic garnet film similar to the above-mentioned film but containing no gadolinium was made. In this thin magnetic garnet film, the above-mentioned ratio lay in a range from 10 to −10% when temperature was changed in a range from −20° to 60° C. The thin magnetic garnet film according to the present embodiment was used in the same measuring instrument as shown in EMBODIMENT 1. Such an instrument produced favorable experimental results.

In the above-mentioned embodiments, Y,Sm,Lu and Ca were used as the element R in the general formula, Gd as the element Q, and Ge or Al as the element M. The same experiments as in the embodiments were carried out in each of various cases such as the case where only one of Y,Sm,Lu and Ca was used as the element R, the case where La or Bi was used as the element R, the case where Eu,Er,Tm,Tb,Ho,Dy, or Yb was used as the element Q, the case where both of Gd and Eu were as the element Q, the case where Ga,Si,Sc,Mn,In,V, or Cr was used as the element M, and the case where both of Ge and Sc were used as the element M. In these cases, the same results as in the embodiments were obtained.

As has been explained in the foregoing, in a measuring instrument of magnetic field according to the present invention, the variation of measured values of magnetic field with temperature can be neglected. Accordingly, the present invention has a remarkable effect on the stabilization of measurement accuracy.

Obviously many modifications and variations of the present invention are possible in the light of the above teachings. It is therefore to be understood that within the scope of the appended claims the invention may be practiced otherwise than as specifically described.

What is claimed is:

1. A measuring instrument of magnetic field comprising:
   a light source part;
   a magnetic filed sensing part including a magnetic material, said magnetic material being provided with a medium capable of exhibiting Faraday rotation, said medium having at least one thin magnetic garnet film, means for providing linearly-polarized light from said light source to be vertically indicent upon said at least one thin magnetic garnet film, said thin magnetic garnet film having a composition expressed by a general formula $R_{3-x}Q_x(Fe_{5-y}M_y)O_{12}$ (where R is at least one element selected from a group consisting of Y, La, Lu, Ca, Sm and Bi, Q is at least one element selected from a group consisting of Gd, Eu, Er, Tb, Yb, Ho and Dy, M is at least one element selected from a group consisting of Ga, Al, Ge, Si, Sc, Mn, In, V and Cr, the value of x lies in a range expressed by a formula $0.1 \leq x \leq 3.0$, and the value of y lies in range expressed by a formula $0 \leq y \leq 5.0$) so as to provide temperature-compensation for said magnetic field measuring instrument, said thin magnetic garnet film being magnetized in a propagation direction of the linearly-polarized light;
   a measuring part for receiving and processing light from said magnetic field sensing part; and
   an optical transmission line for optically connecting said light source part, said magnetic field sensing part and said measuring part;
   whereby said temperature-compensated measuring instrument enables stable measurement of a magnetic field substantially independent of temperature variation.

2. A measuring instrument of magnetic field according to claim 1, wherein said thin magnetic garnet film is formed on at least one end face of a paramagnetic substrate so that the direction of magnetization in said thin magnetic garnet film is perpendicular to said end face, and said paramagnetic substrate is made of one of gadolinium gallium garnet, neodymium gallium garnet, and samarium gallium garnet.

3. A measuring instrument of magnetic field according to claim 1, wherein, said magnetic field sensing part has a structure that a lens, a polarizer, said magnetic material, an analyzer and another lens are arranged in the order described between said optical transmission line on the side of said light source part and said optical transmission line on the side of said measuring part.

4. A measuring instrument of magnetic field according to claim 3, wherein said magnetic material has a structure that said thin magnetic garnet film is formed on at least one of a pair of surfaces of said paramagnetic substrate, one of which confronts said polarizer and the other confronts said analyzer.

5. A measuring instrument of magnetic field according to claim 3, wherein the transmission axis of said polarizer makes an angle of 45° with the transmission axis of said analyzer.

6. A measuring instrument of magnetic field according to claim 1, wherein said magnetic field sensing part has a structure that a lens, a polarizer, said thin magnetic garnet film, said paramagnetic substrate and a reflecting film are arranged on an end face of said optical transmission line in the order described.

7. A measuring instrument of magnetic field according to claim 1 wherein the value of x in said general formula lies in a range expressed by a formula $0.1 \leq x \leq 0.9$.

8. A measuring instrument of magnetic field according to claim 1 wherein the value of x in said general formula lies in a range expressed by a formula $0.1 \leq x \leq 0.5$.

9. A measuring instrument of magnetic field according to claim 1 wherein the value of x in said general formula is nearly equal to 0.2.

10. A measuring instrument of magnetic field according to claim 1, wherein said element Q in said general formula is gadolinium.

11. A measuring instrument of magnetic field according to claim 10, wherein said element R in said general formula includes yttrium, samarium, lutetium and calcium, said element M in said general formula is germanium, and the value of y in said general formula lies in a range from 0.6 to 0.9.

12. A measuring instrument of magnetic field according to claim 1, wherein said magnetic material is formed by combining a plurality of paramagnetic substrates each having said thin magnetic garnet film on at least one end face thereof are combined with each other, in such a manner that thin magnetic garnet films on said paramagnetic substrates are parallel to each other.

13. A measuring instrument of magnetic field according to claim 1, wherein said magnetic substrate is formed by combining a paramagnetic substrate having a first thin magnetic garnet film on at least one end face thereof with another paramagnetic substrate having a second thin magnetic garnet film on at least one end face thereof, in such a manner that said first thin magnetic garnet film is parallel to said second thin magnetic garnet film, and wherein the value of x in said general formula corresponding to a composition of said first thin magnetic garnet film and the value of x in said general formula corresponding to a composition of said second thin magnetic garnet film are selected so that a temperature characteristic of Faraday rotation in said first thin magnetic garnet film and a temperature characteristic of Faraday rotation in said second thin magnetic garnet film compensate each other.

14. A measuring instrument of magnetic field according to claim 1, wherein said magnetic material includes at least one paramagnetic substrate having a first thin magnetic garnet film on one of a pair of parallel end faces thereof and a second thin magnetic garnet film on the other end face, and wherein the value of x in said general formula corresponding to a composition of said first thin magnetic garnet film and the value of x in said general formula corresponding to a composition of said second thin magnetic garnet film are selected so that a temperature characteristic of Faraday rotation in said first thin magnetic garnet film and a temperature characteristic of Faraday rotation in said second thin magnetic garnet film compensate each other.

15. A measuring instrument of magnetic field according to claim 13 wherein the value of x in said general formula corresponding to a composition of said first thin magnetic garnet film lies in a range expressed by a formula $0.3 \leq x \leq 3.0$, and the value of x in said general formula corresponding to a composition of said second thin magnetic garnet film is nearly equal to zero.

16. A measuring instrument of magnetic field according to claim 15, wherein the value of x in said general formula corresponding to a composition of said first thin magnetic garnet film lies in a range expressed by a formula $0.5 \leq x \leq 1.5$.

17. A measuring instrument of magnetic field according to claim 15, wherein the value of x in said general formula corresponding to a composition of said first thin magnetic garnet film is nearly equal to 0.7.

18. A measuring instrument of magnetic field according to claim 13 wherein said element Q in said general formula is gadolinium.

19. A measuring instrument of magnetic field according to claim 18, wherein said element R in said general formula includes yttrium, samarium, lutetium and calcium, said element M in said general formula is germanium, and the value of y in said general formula lies substantially in a range from 0.6 to 0.9.

20. A measuring instrument of magnetic field according to claim 1 wherein that portion of said magnetic field sensing part which follows a polarizer, is divided into two systems, wherein a relation between a ratio $V_e d_m / V_e' d_m'$ and temperature is previously stored in first storage means, where $V_e$ and $V_e'$ indicate respective Verdet's constants of two thin magnetic garnet films which are different from each other in composition and are provided in respective magnetic materials of said systems, and $d_m$ and $d_m'$ indicate respective thicknesses of said thin magnetic garnet films, wherein a ratio $$\left(\frac{P_2}{KP_1} - \tfrac{1}{2}\right) / \left(\frac{P_2'}{K'P_1} - \tfrac{1}{2}\right)$$

is calculated by temperature-determining means to determine a temperature of said magnetic sensing part by said temperature-determining means on the basis of said calculated ratio $$\left(\frac{P_2}{KP_1} - \tfrac{1}{2}\right) / \left(\frac{P_2'}{K'P_1} - \tfrac{1}{2}\right)$$

and said relation stored in said first storage means, where K and K' indicate transmission efficiencies of respective light having passed through said magnetic materials, $P_1$ indicates an output due to light having reached a photo-detector without passing through said magnetic field sensing part, and $P_2$ and $P_2'$ indicate outputs due to respective light having passed through said magnetic materials, wherein a temperature characteristic of a product $V_e d_m$ is previously stored in second storage means, wherein a corrected value of $V_e d_m$ is calculated by temperature correction means on the basis of a temperature value from said temperature-determining means and said temperature characteristic of $V_e d_m$ stored in said second storage means, and wherein said first storage means, temperature-determining means, second storage means and temperature correction means are provided in said measuring part.

21. A measuring instrument of magnetic field according to claim 1, wherein the value of y in said general formula lies in a range expressed by a formula $0.3 \leq y \leq 1.0$.

22. A measuring instrument of magnetic field according to claim 21, wherein the value of y in said general formula is 0.6.

23. A measuring instrument of magnetic field according to claim 1, wherein the value of y in said general formula lies in a range expressed by a formula $0 \leq y \leq 1.5$.

* * * * *